US007667483B2

United States Patent
Kwean

(10) Patent No.: US 7,667,483 B2
(45) Date of Patent: Feb. 23, 2010

(54) CIRCUIT AND METHOD FOR CONTROLLING TERMINATION IMPEDANCE

(75) Inventor: Ki-Chang Kwean, Kyoungki-do (KR)

(73) Assignee: Hynix Semiconductor, Inc., Gyeonggi-do (KR)

(*) Notice: Subject to any disclaimer, the term of this patent is extended or adjusted under 35 U.S.C. 154(b) by 38 days.

(21) Appl. No.: 12/164,171

(22) Filed: Jun. 30, 2008

(65) Prior Publication Data
US 2009/0261856 A1   Oct. 22, 2009

(30) Foreign Application Priority Data
Apr. 21, 2008   (KR) .................. 10-2008-0036601

(51) Int. Cl.
*H03K 19/003* (2006.01)
(52) U.S. Cl. .......................... 326/30; 326/26
(58) Field of Classification Search .............. 326/26, 326/30, 31
See application file for complete search history.

(56) References Cited

U.S. PATENT DOCUMENTS 6,747,475 B2 *  6/2004  Yuffe et al. ............. 326/30
7,288,959 B1 *  10/2007  Lee ........................ 326/30
7,304,495 B2 *  12/2007  Nygren .................. 326/30

FOREIGN PATENT DOCUMENTS

KR   1020030090882 A   12/2003
KR   1020030096564 A   12/2003

OTHER PUBLICATIONS

Notice of Allowance issued from Korean Intellectual Property Office on Apr. 30, 2009 with an English Translation.

* cited by examiner

Primary Examiner—James Cho
(74) Attorney, Agent, or Firm—IP & T Law Firm PLC

(57) ABSTRACT

A calibration circuit that can prevent a calibration operation from being delayed by a dummy capacitor when the calibration circuit starts to operate includes a switch unit configured to connect a calibration node to a precharge node in response to an enable signal. The calibration node is connected to an external resistor. The calibration circuit also includes a code generation unit configured to generate a calibration code in response to a voltage of the calibration node and a reference voltage, a calibration resistor unit configured to drive the calibration node in response to the calibration code and turn-off when the code generation unit is disabled, and a precharge unit configured to precharge the precharge node to a predetermined voltage level when the code generation unit is disabled.

13 Claims, 4 Drawing Sheets

CIRCUIT AND METHOD FOR CONTROLLING TERMINATION IMPEDANCE

CROSS-REFERENCE TO RELATED APPLICATION

The present invention claims priority of Korean patent application number 10-2008-0036601, filed on Apr. 21, 2008, which is incorporated by reference in its entirety.

BACKGROUND OF THE INVENTION

The present invention relates to a circuit for controlling termination impedance, more particularly to a calibration circuit of an on die termination (ODT) device, which can generate a calibration code through a fast calibration operation.

Semiconductor devices, for example, central processing units (CPUs), memories, and gate arrays, which are implemented with integrated circuit (IC) chips, are incorporated into a variety of electrical products such as personal computers, servers and workstations. Most semiconductor devices include an input circuit configured to receive signals from the outside world via input pads and an output circuit configured to provide internal signals to the outside via output pads.

As the operating speed of electrical products has increased, the swing width (that is the difference between high and low logic levels) of a signal interfaced between semiconductor devices gradually has been reduced in order to minimize a delay time taken for signal transmission. However, the reduction in the swing width of the signal easily exposes the signal to external noise, causing signal reflection to become more critical at an interface terminal due to impedance mismatch. Such impedance mismatch is generally caused by external noise, a variation of a power supply voltage, a change in operating temperature, a change in a manufacturing process, etc. The impedance mismatch may lead to a difficulty in high-speed transmission of data and distortion of output data. Therefore, if semiconductor devices receive the distorted output signal through an input terminal, this frequently gives rise to problems such as a setup/hold failure and an error in a decision as to an input level.

In particular, in order to resolve the above problems, a memory device requiring high-speed performance employs an impedance matching circuit, which is called an ODT device, near an input pad inside an IC chip. In a typical ODT scheme, source termination is performed at a transmitting end by an output circuit, and parallel termination is performed by a termination circuit connected in parallel with respect to an input circuit.

To match the termination impedance, the resistance of the ODT device, e.g., a termination resistance at a DQ (data) pad in a memory device, is calibrated using calibration codes. The calibration codes result from ZQ calibration, which is a procedure for generating calibration codes that varies with process, voltage and temperature (PVT) conditions. The ZQ calibration is referred to as such because the calibration is performed using a ZQ node, which is a node for calibration.

A calibration circuit of the conventional ODT device for generating the calibration codes will be described below.

FIG. 1 is a circuit diagram of a conventional calibration circuit of an ODT device.

Referring to FIG. 1, the conventional calibration circuit includes a code generation unit 120 and a calibration resistor unit 110.

The code generation unit 120 generates a calibration code CODE<0:N> in response to a voltage of a calibration node ZQ and a reference voltage $$\left(\text{generally } \frac{VDDQ}{2}\right).$$

The code generation unit 120 includes a comparison unit 121, a counting unit 122, and a transfer unit 123. The comparison unit 121 compares the voltage of the calibration node ZQ with the reference voltage VREF to generate an up/down signal. The comparison unit 121 performs the comparison operation when the enable signal ENABLE is in an activated state, while it does not operate when the enable signal ENABLE is in a deactivated state.

The counting unit 122 increases or decreases the calibration code CODE<0:N> in response to the up/down signal output from the comparison unit 121. The counting unit 122 increases or decreases the calibration code CODE<0:N> in response to the output of the comparison unit 121 when the enable signal ENABLE is in the activated state, but it stops increasing or decreasing the calibration code CODE<0:N> and maintains the final code value when the enable signal ENABLE is in the deactivated state.

The transfer unit 123 transfers the calibration code CODE<0:N> to the calibration resistor unit 110 without change when the enable signal ENABLE is activated. On the other hand, the transfer unit 123 disables the calibration code CODE<0:N> and transfers the disabled calibration code CODE<0:N> when the enable signal ENABLE is deactivated. The disabling of the calibration code CODE<0:N> means that all resistors of the calibration resistor unit 110 are disconnected. Since transistors included in the calibration resistor unit 110 are PMOS transistors, the disabling of the calibration code CODE<0:N> means that the calibration code CODE<0:N> has a value of <1,1,1,1, . . . >.

The calibration resistor unit 110 drives the calibration node ZQ while the parallel transistors are turned on/off in response to the calibration code CODE<0:N>. As described above, when the code generation unit 120 is disabled, that is, the enable signal ENABLE is deactivated, the transfer unit 123 disables the calibration code CODE<0:N> and transfers the disabled calibration code CODE<0:N> to the calibration resistor unit 110. Therefore, when the enable signal ENABLE is deactivated, all the parallel transistors of the calibration resistor unit 110 are turned off.

An operation of the code generation unit 120 at enabled state, that is, when the enable signal ENABLE is activated, will be described below. Since the transfer unit 123 merely transfers the calibration code CODE<0:N> of the counting unit 122 to the calibration resistor unit 110 when the enable signal ENABLE is activated, detailed description thereof will be omitted.

The comparison unit 121 compares the reference voltage VREF with the voltage of the calibration node ZQ, which varies according to the resistance ratio of the external resistor 101 to the calibration resistor unit 110, to generate the up/down signal. The counting unit 122 increases or decreases the calibration code CODE<0:N> according to the up/down signal. The decreased calibration code CODE<0:N> is input to the calibration resistor unit 110 to change a total resistance of the calibration resistor unit 110. The changed total resistance of the calibration resistor unit 110 also changes the voltage of the calibration node ZQ. This operation is repeated until the voltage of the calibration node ZQ is equal to the reference voltage VREF.

That the voltage of the calibration node ZQ is equal to the reference voltage VREF means that the total resistance of the calibration resistor unit 110 is equal to the resistance of the external resistor 101. The calibration code CODE<0:N> generated in the above manner is transferred to a termination resistor unit (not shown), which is located at an input/output pad and configured with the same as the calibration resistor unit 110, and determines the termination resistance of the ODT device.

When the code generation unit 120 is disabled, that is, the enable signal ENABLE is deactivated, the comparison unit 121 and the counting unit 122 do not perform the operation of increasing or decreasing the calibration code CODE<0:N> any more. However, the counting unit 122 maintains the value of the calibration code CODE<0:N> that is obtained before it is disabled. This is done for starting the calibration operation from the previous calibration code CODE<0:N> when the code generation unit 120 is again enabled.

When the code generation unit 120 is disabled, the transfer unit 123 disables the calibration code CODE<0:N> and transfers the disabled calibration code CODE<0:N> to the calibration resistor unit 110. Therefore, all the parallel transistors of the calibration resistor unit 110 are turned off. This is done for preventing unnecessary current consumption by blocking current flowing from the calibration resistor unit 110 to the external resistor 101.

Since the external resistor 101 is disposed outside the semiconductor device chip, a dummy capacitor having a large capacitance exists in the external resistor. Therefore, when the disabled code generation unit 120 and calibration resistor unit 110 are again enabled to restart the calibration operation, the voltage of the calibration node ZQ moves very late. That is, when the calibration resistor unit 110 is again enabled, the calibration node ZQ does not immediately reach the voltage given by the resistance ratio of the calibration resistor unit 110 to the external resistor 101, but reaches the desired voltage after a delay time due to the dummy capacitor elapses.

When the calibration circuit intends to restart the calibration operation, the delay time always occurs due to the dummy capacitor existing in the external resistor 101 and thus time necessary for the calibration operation is lengthened.

SUMMARY OF THE INVENTION

Embodiments of the present invention are directed to providing a calibration circuit of an ODT device, which can prevent a calibration operation from being delayed by a dummy capacitor when the calibration circuit starts to operate.

In accordance with an aspect of the invention, a calibration circuit includes a switch unit configured to connect a calibration node to a precharge node in response to an enable signal, the calibration node being connected to an external resistor, a code generation unit configured to generate a calibration code in response to a voltage of the calibration node and a reference voltage, a calibration resistor unit configured to drive the calibration node in response to the calibration code and turn-off when the code generation unit is disabled, and a precharge unit configured to precharge the precharge node to a predetermined voltage level when the code generation unit is disabled.

In accordance with another aspect of the invention, an impedance matching circuit includes a code generation unit configured to generate a calibration code according to a voltage of the calibration node and a reference voltage in response to an enable signal, a calibration resistor unit configured to drive the calibration node in response to the calibration code and turn-off when the code generation unit is disabled, and a driving unit configured to drive the calibration node to a predetermined voltage level when the enable signal is activated.

DESCRIPTION OF SPECIFIC EMBODIMENTS

Hereinafter, a calibration circuit of an ODT device in accordance with the present invention will be described in detail with reference to the accompanying drawings.

Figure 2:
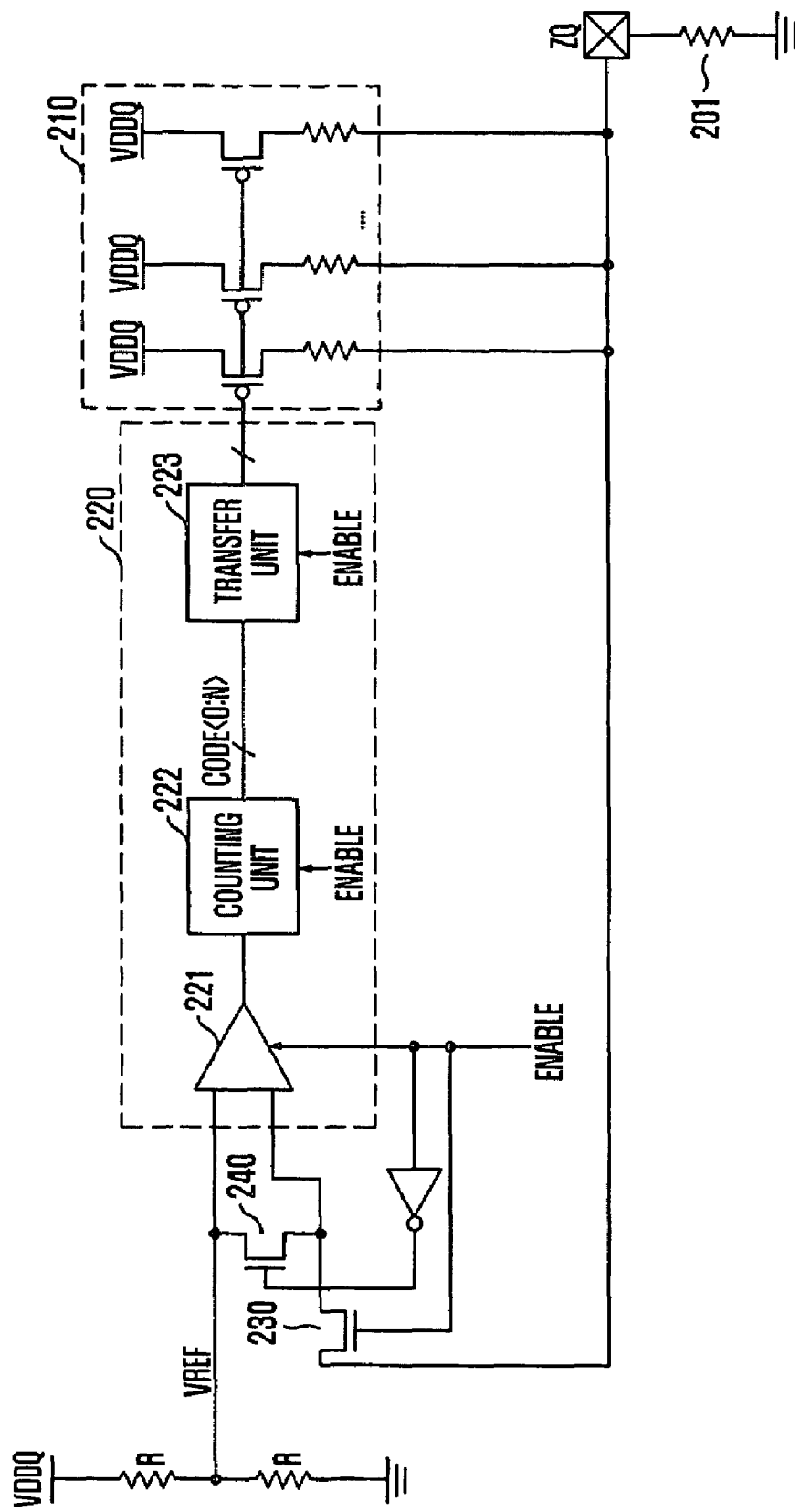
FIG. 2 is a circuit diagram of a calibration circuit in accordance with an embodiment of the present invention.

FIG. 2 is a circuit diagram of a calibration circuit in accordance with an embodiment of the invention.

Referring to FIG. 2, the calibration circuit includes a calibration resistor unit 210, a code generation unit 220, a switch unit 230, and a precharge unit 240. The switch unit 230 opens/closes a calibration node ZQ, which is connected to an external resistor 201, and a precharge node P_NODE in response to an enable signal ENABLE. The code generation unit 220 is enabled in response to the enable signal ENABLE and generates a calibration code CODE<0:N> in response to a voltage of the calibration node ZQ and a reference voltage VREF. The calibration resistor unit 210 drives the calibration node ZQ in response to the calibration code CODE<0:N> and is disabled when the code generation unit 220 is disabled. The precharge unit 240 precharges the precharge node P_NODE to a predetermined voltage level when the code generation unit 220 is disabled.

The switch unit 230 connects (closes) the calibration node ZQ to the precharge node P_NODE when the enable signal ENABLE is activated, that is, while the calibration circuit generates the calibration code CODE<0:N>. Therefore, the code generation unit 220 can generate the calibration code CODE<0:N> in the same manner as the related art by comparing the voltage of the precharge node P_NODE with the reference voltage VREF. When the enable signal ENABLE is deactivated, the switch unit 230 disconnects (opens) the calibration node ZQ from the precharge node P_CODE. When the enable signal ENABLE is deactivated, the code generation unit 220 stops generating the calibration code CODE<0:N>. Therefore, there is no problem in operation even though the calibration node ZQ is separated from the precharge node P_NODE. The switch unit 230 may be implemented with a transistor configured to open/close the calibration node ZQ and the precharge node P_NODE in response to the enable signal ENABLE.

The precharge unit 240 has no influence on the precharge node P_NODE when the enable signal ENABLE is activated, that is, while calibration circuit generates the calibration code CODE<0:N>. Therefore, the code generation unit 220 can generate the calibration code CODE<0:N> in the same manner as the related art. When the enable signal ENABLE is deactivated, the precharge unit precharges the precharge node P_NODE to a predetermined voltage level.

In the conventional calibration circuit, the voltage level of the calibration node ZQ is decreased when the enable signal ENABLE is deactivated. Accordingly, when the enable signal ENABLE is activated, it takes a long time to increase the voltage level of the calibration node ZQ to the original voltage level due to a dummy capacitor existing in the external resistor 201. Therefore, time of the calibration operation to generate the calibration node CODE<0:N> becomes long. However, in accordance with the embodiment of the invention, the precharge node P_NODE is precharged to a predetermined voltage level when the enable signal ENABLE is in the deactivated state. When the enable signal ENABLE is again activated, the precharge node P_NODE and the calibration node ZQ are connected together and thus a current of the precharge node P_NODE flows into the calibration node ZQ. Therefore, the voltage level of the calibration node ZQ can be quickly recovered to the original voltage level. Consequently, it is possible to solve the problem that the operation of the calibration circuit becomes slow due to the dummy capacitor existing in the existing resistor 201.

Precharging the precharge node P_NODE to a predetermined voltage level is done for quickly recovering the lowered voltage level of the calibration node ZQ. It is desired for the predetermined voltage level to be similar to the reference voltage VREF. In FIG. 2, the precharge unit 240 is implemented with the transistor configured to open/close the reference voltage VREF and the precharge node P_NODE in response to the enable signal ENABLE, and thus the reference voltage VREF is set as the predetermined voltage level. It is apparent that the predetermined voltage can be supplied in various methods. For example, the power supply voltage is divided and supplied as a precharge voltage.

The code generation unit 220 is enabled in response to the enable signal ENABLE and compares the voltage of the calibration node ZQ with the reference voltage VREF to generate the calibration code CODE<0:N> according to the comparison result. Although it is shown in FIG. 2 that the code generation unit 220 compares the voltage of the precharge node P_NODE with the reference voltage VREF, the precharge node P_NODE and the calibration node ZQ are connected together when the code generation unit 220 is operating (when the enable signal ENABLE is in an activated state), so that the code generation unit 220 generates the calibration code CODE<0:N> in response to the voltage of the calibration node ZQ and the reference voltage VREF.

The code generation unit 220 includes a comparison unit 221, a counting unit 222, and a transfer unit 223. The comparison unit 221 is enabled in response to the enable signal ENABLE and compares the voltage of the precharge node P_NODE with the reference voltage VREF. The counting unit 222 is enabled in response to the enable signal ENABLE and increases or decreases the calibration code CODE<0:N> according to the comparison result of the comparison unit 221. When the enable signal ENABLE is activated, the transfer unit 223 transfers the calibration code CODE<0:N> to the calibration resistor unit 210. On the other hand, when the enable signal ENABLE is deactivated, the transfer unit 223 disables the calibration code CODE<0:N> and transfers the disabled calibration code CODE<0:N> to the calibration resistor unit 210.

Since the calibration resistor unit 210 is well known, its detailed description will be omitted.

Figure 3:
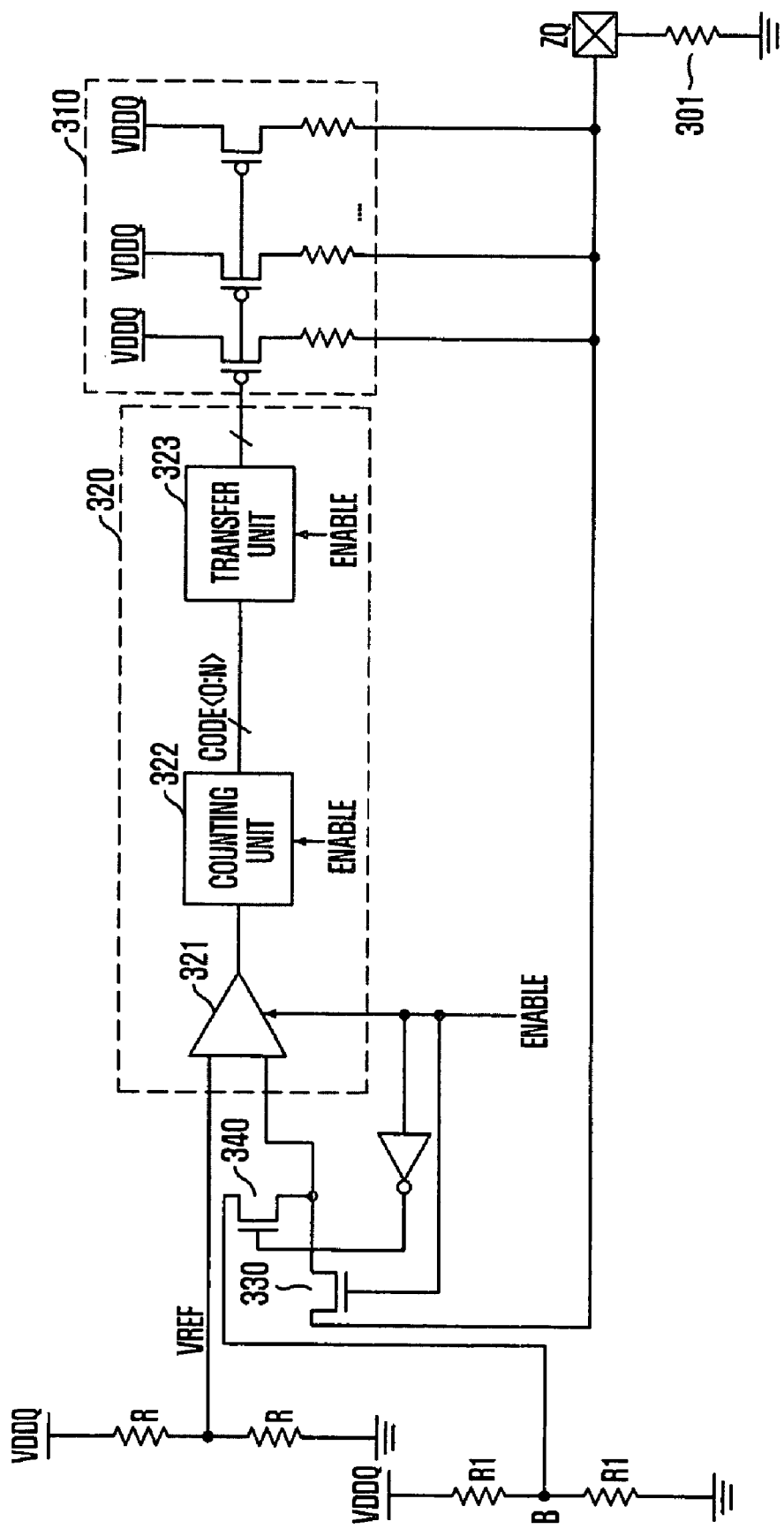
FIG. 3 is a circuit diagram of a calibration circuit in accordance with another embodiment of the invention.

FIG. 3 is a circuit diagram of a calibration circuit of an ODT device in accordance with another embodiment of the invention.

Unlike the calibration circuit of FIG. 2, a separate voltage B, instead of the reference voltage VREF, is used as a precharge voltage. In this way, it is possible to prevent noise from being introduced into the reference voltage (VREF) node by the precharge operation.

Since the calibration circuit of FIG. 3 has the same structure and operation as the calibration circuit of FIG. 2, with the exception that the separate voltage B instead of the reference voltage VREF is used during the precharge operation, further detailed description thereof will be omitted.

Figure 4:
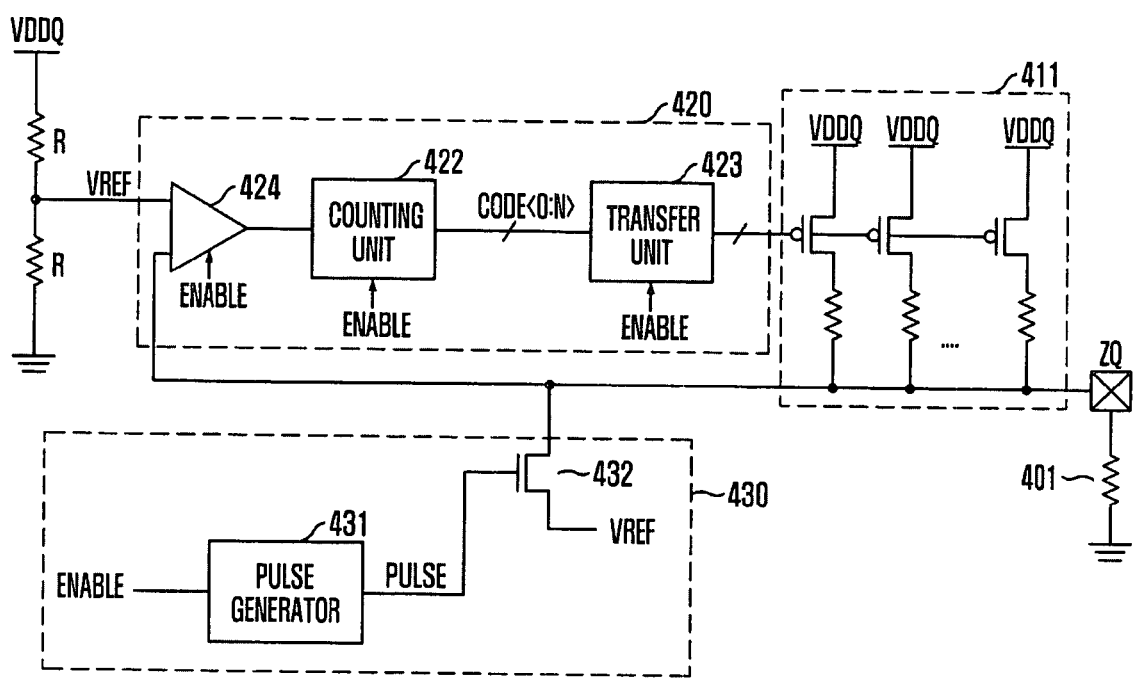
FIG. 4 is a circuit diagram of a calibration circuit in accordance with further embodiment of the invention.
Figure 4:
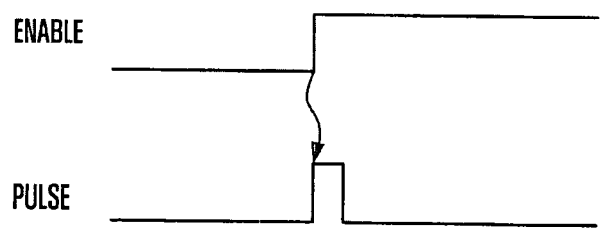

FIG. 4 is a circuit diagram of a calibration circuit in accordance with further embodiment of the invention.

Referring to FIG. 4, the calibration circuit includes a calibration resistor unit 410, a code generation unit 420, and a driving unit 430. The code generation unit 420 is enabled in response to an enable signal ENABLE and generates a calibration code CODE<0:N> in response to a voltage of a calibration node ZQ and a reference voltage VREF. The calibration resistor unit 410 drives the calibration node ZQ in response to the calibration code CODE<0:N> and is disabled when the code generation unit 420 is disabled. The driving unit 430 drives the calibration node ZQ to the predetermined voltage VREF when the enable signal ENABLE is activated.

Figure 1:
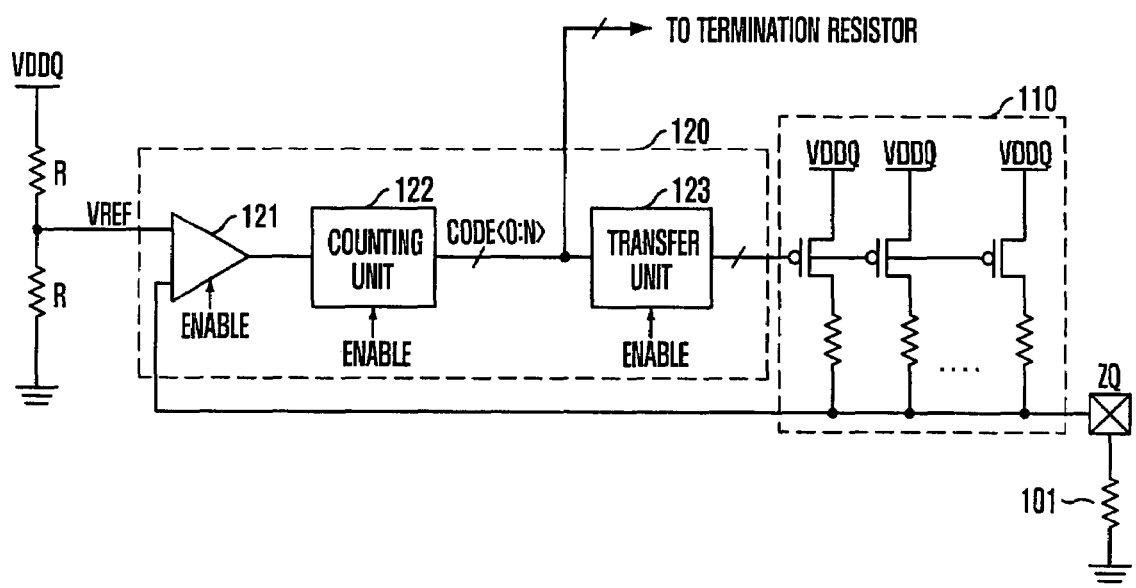
FIG. 1 is a circuit diagram of a conventional calibration circuit of an ODT device.

Compared with the conventional calibration circuit of FIG. 1, the calibration circuit of FIG. 4 further includes the driving unit 430.

The driving unit 430 supplies the predetermined voltage VREF to the calibration node ZQ for a short time when the enable signal ENABLE is activated. Therefore, it is possible to reduce time that is necessary until the voltage level of the calibration node ZQ is recovered to the original level when the disabled calibration circuit is again enabled. That is, the delay time due to the dummy capacitor can be reduced.

The driving unit 430 must drive the calibration node ZQ to the predetermined voltage VREF for a short time when the calibration circuit starts to be enabled. The driving unit 430 aims at reducing time that is necessary until the voltage level of the calibration node ZQ is recovered at an early time when the driving unit 430 is enabled, not determining the voltage level of the calibration node ZQ.

The driving unit 430 may include a pulse generator 431 and a voltage supplier 432.

The pulse generator 431 generates a pulse signal PULSE that is activated for a short time when the enable signal ENABLE is activated. The pulse width of the pulse signal PULSE is changed according to the size of the dummy capacitor generated at an external resistor 401. As the dummy capacitor is larger, the pulse width of the pulse signal PULSE must be set to be large.

As described above, the driving unit 430 functions to reduce time that is necessary until the voltage level of the calibration node ZQ is recovered to the original level, not to determine the voltage level of the calibration node ZQ. Therefore, the pulse width of the pulse signal PULSE should not be too large.

The voltage supplier 432 supplies the predetermined voltage VREF to the calibration node ZQ in response to the pulse signal PULSE during the activation period of the pulse signal PULSE. Although the reference voltage VREF is exemplified as the predetermined voltage in FIG. 4, it is apparent that any voltage can be used as the predetermined voltage if it has a level close to the reference voltage VREF.

In accordance with the embodiments of the invention, the calibration circuit precharges the precharge node to the predetermined voltage level when the calibration operation is disabled. If the calibration operation starts in such a state, the precharged precharge node is connected to the calibration node. Therefore, it is possible to solve the problem that the calibration operation becomes slow due to the dummy capacitor existing in the external resistor.

While the invention has been described with respect to the specific embodiments, it will be apparent to those skilled in the art that various changes and modifications may be made without departing from the spirit and scope of the invention as defined in the following claims.

What is claimed is:

1. A calibration circuit, comprising:
    a switch unit configured to connect a calibration node to a precharge node in response to an enable signal;
    a code generation unit configured to generate a calibration code in response to a voltage of the calibration node and a reference voltage;
    a calibration resistor unit configured to drive the calibration node in response to the calibration code and to turn-off if the code generation unit is disabled; and
    a precharge unit configured to precharge the precharge node to a predetermined voltage level if the code generation unit is disabled.

2. The calibration circuit as recited in claim 1, wherein the code generation unit stops generating the calibration code if the enable signal is deactivated.

3. The calibration circuit as recited in claim 1, wherein the code generation unit includes:
    a comparison unit configured to compare a voltage of the precharge node with the reference voltage in response to the enable signal;
    a counting unit configured to increase or decrease the calibration code according to a comparison result of the comparison unit; and
    a transfer unit configured to transfer the calibration code to the calibration resistor unit if the enable signal is activated, and to disable the calibration code and transfer the disabled calibration code to the calibration resistor unit if the enable signal is deactivated.

4. The calibration circuit as recited in claim 3, wherein, if the enable signal is deactivated, the counting unit stops increasing and decreasing the calibration code and stores the calibration code.

5. The calibration circuit as recited in claim 1, wherein the predetermined voltage level is equal to the level of the reference voltage.

6. The calibration circuit as recited in claim 1, wherein the precharge unit includes a transistor configured to supply the predetermined voltage to the precharge node in response to the enable signal.

7. The calibration circuit as recited in claim 1, wherein the predetermined voltage is generated by division of a power supply voltage.

8. An impedance matching circuit, comprising:
    a code generation unit configured to generate a calibration code according to a voltage of the calibration node and a reference voltage, in response to an enable signal;
    a calibration resistor unit configured to drive the calibration node in response to the calibration code and turn-off if the code generation unit is disabled; and
    a driving unit configured to drive the calibration node to a predetermined voltage level if the enable signal is activated.

9. The impedance matching circuit as recited in claim 8, wherein the code generation unit stops generating the calibration code if the enable signal is deactivated.

10. The impedance matching circuit as recited in claim 8, wherein the code generation unit includes:
    a comparison unit configured to compare a voltage of the calibration node with the reference voltage in response to the enable signal;
    a counting unit configured to increase or decrease the calibration code according to a comparison result of the comparison unit; and
    a transfer unit configured to transfer the calibration code to the calibration resistor unit if the enable signal is activated, and to disable the calibration code and transfer the disabled calibration code to the calibration resistor unit if the enable signal is deactivated.

11. The impedance matching circuit as recited in claim 10, wherein, if the enable signal is deactivated, the counting unit stops increasing and decreasing the calibration code and stores the calibration code.

12. The impedance matching circuit as recited in claim 8, wherein the predetermined voltage level is equal to the level of the reference voltage.

13. The impedance matching circuit as recited in claim 8, wherein the driving unit includes:
    a pulse generator configured to generate a pulse signal that is activated for a short time if the enable signal is activated; and
    a voltage supplier configured to supply the predetermined voltage to the calibration node in response to the pulse signal.

* * * * *